United States Patent
Iguchi et al.

(10) Patent No.: US 6,297,174 B2
(45) Date of Patent: Oct. 2, 2001

(54) METHOD FOR THE FORMATION OF A PLANARIZING COATING FILM ON SUBSTRATE SURFACE

(75) Inventors: Etsuko Iguchi, Machida; Takako Hirosaki, Kanagawa-ken; Masakazu Kobayashi, Chigasaki, all of (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/765,276

(22) Filed: Jan. 22, 2001

Related U.S. Application Data

(63) Continuation of application No. 09/337,472, filed on Jun. 21, 1999, now abandoned.

(30) Foreign Application Priority Data

Jun. 24, 1998 (JP) .................................................. 10-177524

(51) Int. Cl.$^7$ .................................................. H01L 21/31
(52) U.S. Cl. .................... 438/781; 438/763; 438/780; 427/240; 427/385.5
(58) Field of Search .................................... 438/763, 780, 438/781; 427/240, 385.5

(56) References Cited

U.S. PATENT DOCUMENTS 5,677,380 * 10/1997 Matsumura et al. ................. 525/107

FOREIGN PATENT DOCUMENTS

| 5-32410 | 2/1993 | (JP) . |
| 5-202228 | 8/1993 | (JP) . |
| 8-143818 | 6/1996 | (JP) . |

OTHER PUBLICATIONS

Wolf et al., "Silicon Processing for the VSLI Era", vol. 1, pp. 430–432, 1986, no month.

* cited by examiner

Primary Examiner—John F. Niebling
Assistant Examiner—Alexander G. Ghyka
(74) Attorney, Agent, or Firm—Wenderoth, Lind & Ponack, L.L.P.

(57) ABSTRACT

A method is disclosed for the formation of a planarizing coating film on the surface of a substrate having a stepped level difference under processing for the manufacture of semiconductor devices. The inventive method capable of giving a planarizing coating film of excellent planarity and good adhesion to the substrate surface comprises the steps of:

(a) coating the substrate surface with a coating solution containing, as a film-forming solute uniformly dissolved in an ,organic solvent, a nitrogen-containing organic compound such as benzoguanamine and melamine having, in a molecule, at least two amino and/or imino groups each substituted for the nitrogen-bonded hydrogen atom by a hydroxyalkyl group or an alkoxyalkyl group to form a coating layer;

(b) drying the coating layer by evaporating the organic solvent to form a dried coating layer; and (c) subjecting the dried coating layer to a baking treatment at a temperature in the range from 150 to 250° C.

6 Claims, No Drawings

METHOD FOR THE FORMATION OF A PLANARIZING COATING FILM ON SUBSTRATE SURFACE

This is a continuation of Ser. No. 09/337,472 filed Jun. 21, 1999, now abandoned.

BACKGROUND OF THE INVENTION

The present invention relates to a method for the formation of a planarizing coating film on the surface of a substrate having stepped level differences or, more particularly, to a method for the formation of a planarizing coating film having an excellently flat and smooth surface on a substrate surface having stepped level differences by using a unique coating solution containing a planarizing film-forming organic ingredient.

It is a remarkable trend in the modern technological field of semiconductor devices that the electronic circuit wiring is constructed on the surface of a substrate such as a semiconductor silicon wafer with a higher and higher degree of integration density with an increase in the fineness so that it is sometimes the case that the circuit wiring layer is formed to have a multilayered structure. As a consequence of such a multilayered structure of the circuit wiring layer, the surface of the substrate in an intermediate stage of processing with formation of a multilayered circuit wiring layer or layers cannot be flat enough but has a stepped level difference with raises and recesses on the surface not to be suitable for a further photolithographic patterning work thereon resulting in a great adverse influence on the performance and reliability of the semiconductor device as the final product. It is accordingly an established technique that a photolithographic patterning work on a non-even surface is preceded by the formation of a planarizing coating film having a flat and uniform surface to cover the raised and recessed surface areas.

A great variety of coating solutions are proposed and practically employed in the prior art for the formation of a planarizing coating film. Besides the basic requirements for the planarizing coating solutions that excellent planarization can be obtained therewith by reliably and reproducibly filling up the recesses in the extremely fine circuit wiring patterns with further improved wettability to the fine raises and recesses, a planarizing coating film in recent years is required to satisfy the etching rate condition having adaptability to CVD films as a film also having properties as an etch-back material.

Examples of the coating solutions for the formation of a planarizing coating film under current use include a coating solution of which the film-forming ingredient is a hydrolysis-condensation product of an alkoxysilane compound or a halogenosilane compound as disclosed in Japanese Patent Kokai 5-32410 and a coating solution containing a polymethyl silsesquioxane resin and a tetraalkylammonium compound in an organic solvent as disclosed in Japanese Patent Kokai 8-143818. The former coating solution has problems that the coating film formed therefrom, which is an inorganic silicon oxide film or a so-called inorganic SOG film, is liable to cause crack formation when the coating film has a large aspect ratio in addition to the insufficient filling-up adaptability to very fine circuit wiring patterns. The latter coating solution is also defective in respect of incomplete planarization on a stepped substrate surface consequently with a narrow effective focusing depth latitude in the pattern-wise exposure of a photoresist layer formed on the planarizing coating film to light leading to a decrease in the pattern resolution and also in respect of the uncontrollable variation of the etching rate which heavily depends on the residual amount of the solvent and the conditions of the baking treatment including the baking temperature.

In addition to the above described planarizing coating solutions, polyimide resins are proposed as the film-forming resinous ingredient in a coating solution for planarization. A problem in a polyimide resin-based planarizing coating film is that a baking treatment of the coating film sometimes results in a decrease in the surface planarity of the coating film necessitating a reflow treatment in addition to the problem in the filling-up behavior inhibiting practical application of those resins.

SUMMARY OF THE INVENTION

The present invention accordingly has an object to provide a novel and improved method for the formation of a planarizing coating film on a substrate surface having stepped level differences to be freed from the above described problems and disadvantages in the prior art methods by using a conventional coating solution for planarization.

Thus, the method of the present invention for the formation of a planarizing coating film on a substrate surface comprises the steps of:

(a) coating the substrate surface with a coating solution containing, as a film-forming solute uniformly dissolved in an organic solvent, a nitrogen-containing organic compound selected from the group consisting of melamine, benzoguanamine, acetoguanamine, glycoluril, urea, thiourea, guanidine, dicyandiamide, alkylene ureas and succinamide having, in a molecule, at least two amino and/or imino groups each substituted for the nitrogen-bonded hydrogen atom by a hydroxyalkyl group or an alkoxyalkyl group to form a coating layer;

(b) drying the coating layer by evaporating the organic solvent to form a dried coating layer; and (c) subjecting the dried coating layer to a baking treatment at a temperature in the range from 150 to 250° C.

DETAILED DESCRIPTION OF THE PREFERRED EMBODIMENTS

Examples of the amino or imino group-containing organic nitrogen compound to be substituted by hydroxyalkyl and/or alkoxyalkyl groups to give the solute compound in the coating solution used in step (a) of the inventive method include melamine, benzoguanamine, acetoguanamine, glycoluril, urea, thiourea, guanidine, dicyandiamide, alkylene ureas, succinamide and the like. Each of these nitrogen-containing organic compounds has two or more of amino and/or imino groups bonded to the carbon atoms in a molecule. It is essential that at least two of the amino/imino groups are substituted for the nitrogen-bonded hydrogen atoms by hydroxyalkyl and/or alkoxyalkyl groups. Examples of the alkyl group to form the hydroxyalkyl or alkoxyalkyl group include those having 1 to 4 carbon atoms such as methyl, ethyl, n-propyl, isopropyl, n-butyl, isobutyl, sec-butyl and tert-butyl groups. Examples of the alkoxy groups to alkoxylate the above mentioned alkyl groups include those having 1 to 4 carbon atoms such as methoxy, ethoxy, n-propoxy and n-butoxy groups. The position of substitution on the alkyl groups by the hydroxyl or alkoxy group is not particularly limitative.

When the nitrogen-containing organic compound has two or more amino/imino groups in a molecule, it is optional that a part or all of the amino/imino groups are substituted by the hydroxyalkyl and/or alkoxyalkyl groups. It is further optional that the nitrogen-containing organic compound has, besides amino/imino groups, other substituent groups such as nitro, cyano and carboxyl groups and halogen atoms.

Particular examples of the nitrogen-containing organic compound having amino/imino groups substituted by hydroxyalkyl and/or alkoxyalkyl groups suitable as the solute in the coating solution used in the inventive method include, though not particularly limitative thereto, methoxymethylated melamines, methoxymethylated-butoxymethylated melamines, butoxymethylated melamines, carboxyl group-containing methoxymethylated-isobutoxymethylated melamines, methoxymethylated benzoguanamines, methoxymethylated-ethoxymethylated benzoguanamines, methoxymethylated-butoxymethylated benzoguanamines, butoxymethylated benzoguanamines, butoxymethylated glycolurils, carboxyl group-containing methoxymethylated-ethoxymethylated glycolurils, methylolated benzoguanamines, methylolated glycolurils and the like, of which methoxymethylated benzoguanamines and methoxymethylated melamines are particularly preferable, although any of these compounds can be used either singly or as a combination of two kinds or more according to need.

The coating solution used in step (a) of the inventive method is prepared by uniformly dissolving the above described nitrogen-containing organic compound in a suitable organic solvent. Examples of the organic solvents include, though not particularly limitative thereto, monohydric alcohols such as methyl, ethyl, propyl and butyl alcohols, polyhydric alcohols such as ethyleneglycol, diethyleneglycol and propyleneglycol, derivatives of polyhydric alcohols such as ethyleneglycol monomethyl ether, ethyleneglycol monoethyl ether, ethyleneglycol monopropyl ether, ethyleneglycol monobutyl ether, propyleneglycol monomethyl ether, propyleneglycol monoethyl ether, propyleneglycol monopropyl ether, propyleneglycol monobutyl ether, ethyleneglycol monomethyl ether acetate, ethyleneglycol monoethyl ether acetate, propyleneglycol monomethyl ether acetate and propyleneglycol monoethyl ether acetate, and so on, of which alkyleneglycol monoalkyl ethers and esters thereof such as propyleneglycol monomethyl ether and acetate thereof are particularly preferable, although any of these organic solvents can be used either singly or as a mixture of two kinds or more according to need.

The concentration of the hydroxyalkyl/alkoxyalkyl-substituted nitrogen-containing organic compound in the coating solution used in step (a) of the inventive method is not particularly limitative and can be selected in the range of conventional concentrations depending on the particular object of planarization although the concentration can be as high as 85% by weight or even higher. This extremely high concentration of the planarizing coating solution is in a remarkable contrast with conventional planarizing coating solutions in which the concentration of the film-forming ingredient can rarely exceed about 20% by weight. The high concentration of the film-forming ingredient in the coating solution is particularly advantageous when a planarizing coating film having a large thickness is desired by conducting a single coating work with the coating solution.

Step (a) of the inventive method is conducted by applying the above described planarizing coating solution by a suitable coating method of spinner coating, spray coating, dip coating and the like to the surface of a substrate having stepped level differences by providing, for example, a circuit wiring layer, inorganic coating layer and so on. The amount of coating with the planarizing coating solution naturally depends on the degree of the stepped level differences on the substrate surface to accomplish full planarization.

Step (a) of the inventive method for the formation of a coating layer of the planarizing coating solution is followed by step (b) in which the wet coating layer is freed from the solvent by evaporating the solvent, if necessary, by heating at a temperature not exceeding the boiling point of the solvent to give a dried coating layer.

The thus obtained dried coating layer is then subjected in step (c) of the inventive method to a baking treatment so as to complete a cured planarizing coating film. The baking treatment is conducted in an oxidizing atmosphere such as air at a temperature in the range from 150 to 250° C. The length of time taken for this baking treatment naturally depends on the baking temperature and other factors but a fully cured planarizing coating film can be obtained usually by a baking treatment for 1 to 30 minutes.

Besides the above described film-forming solute, the planarizing coating solution used in the inventive method can be admixed with various kinds of additives having compatibility or miscibility with the film-forming solute including surface active agents and crosslinking promoters with an object to further improve the coating workability and the properties of the planarizing coating film formed by using the solution. Examples of the crosslinking promoters include carboxylic acids such as oxalic acid, maleic acid, 2-hydroxybenzoic acid, 3,5-dinitrobenzoic acid and 2,6-dihydroxybenzoic acid as well as a copolymeric acid which is a copolymer of 2-hydroxybenzoic acid and p-xylene (SAX, a commercial product by Mitsui Chemical Co.), ester compounds such as a dialkylaminoalcohol p-toluenesulfonate, 2,2',4,4'-tetrahydroxybenzophenone and others. These crosslinking promotors can be added to the coating solution in an amount not exceeding 5% by weight based on the amount of the film-forming ingredient. Examples of the surface active agents, which serve to prevent striation in the coating layer, include fluorine-containing ones sold under the trade names of Surflons SC-103 and SR-100 (each a product by Asahi Class Co.), EF-351 (a product by Tohoku Fertilizers Co.), Florads Fc-135, Fc-98, Fc-430, Fc-431 and Fc-176 (each a product by Sumitomo 3M Co.) and the like. These surface active agents can be added to the coating solution in an amount not exceeding 0.2% by weight based on the amount of the film-forming ingredient.

The substrate material provided on the surface with a planarizing coating film according to the inventive method can be subjected to an etch-back treatment so as to further improve the surface planarity of the planarizing coating film. This is because, since the planarizing coating film formed according to the inventive method is a film of an organic material, the rate of etching can readily be controlled in conducting the etching treatment by modifying the composition of the etching gas so that good matching can be accomplished with the underlying layer such as an insulating layer and semiconductor layer. In addition to the extremely high planarity, the thus obtained planarizing coating film exhibits excellent properties such as full wettability to the substrate surface having stepped level differences in an extremely fine pattern.

In the following, the method of the present invention is illustrated in more detail by way of Examples. In the following Examples and Comparative Examples, the planarizing coating film was evaluated in two ways as given below.

(1) Surface Condition of Planarizing Coating Film as Cured

A cross section of the planarizing coating film as formed by undertaking the baking treatment was examined by using a scanning electron microscope.

(2) Surface Condition After Etch-back

A cross section of the planarizing coating film after an etch-back treatment over the whole surface was examined by using a scanning electron microscope.

EXAMPLE 1

A planarizing coating solution was prepared by dissolving a methoxymethylated benzoguanamine in propyleneglycol monomethyl ether acetate in a concentration of 15% by weight.

A semiconductor silicon wafer provided with a circuit wiring layer of aluminum was further provided thereon with an insulating layer of titanium nitride as a first layer and then with a semiconductor layer of polysilicon as the second layer. The substrate material having multilayered coating to have a stepped level difference of 0.20 μm was coated on a spinner with the above prepared coating solution under such a coating condition as to form a uniform coating layer of 0.20 μm thickness on a flat substrate surface followed by a drying treatment by evaporation of the solvent and a baking treatment in air at 180° C. for 90 seconds to complete a cured planarizing coating film.

The planarity of the planarizing coating film as cured was found complete without detecting any stepped level differences on the surface. The planarity of the planarizing coating film after the etch-back treatment was also complete.

EXAMPLE 2

The experimental procedure was substantially the same as in Example 1 except that the planarizing coating solution was prepared by using a methoxymethylated melamine instead of the methoxymethylated benzoguanamine.

The planarity of the planarizing coating film as cured was found complete without detecting any stepped level differences on the surface. The planarity of the planarizing coating film after the etch-back treatment was also complete.

EXAMPLE 3

The experimental procedure was substantially the same as in Example 1 excepting for the replacement of propyleneglycol monomethyl ether acetate as the solvent of the planarizing coating solution with propyleneglycol monomethyl ether.

The planarity of the planarizing coating film as cured was found complete without detecting any stepped level differences on the surface. The planarity of the planarizing coating film after the etch-back treatment was also complete.

EXAMPLE 4

The experimental procedure was substantially the same as in Example 1 except that the planarizing coating solution was a 35% by weight solution of the same methoxymethylated benzoguanamine in propyleneglycol monomethyl ether acetate. This coating solution had good storage stability without any noticeable changes in the properties even after storage for 6 months at room temperature.

The planarity of the planarizing coating film as cured was found complete without detecting any stepped level differences on the surface. The planarity of the planarizing coating film after the etch-back treatment was also complete.

EXAMPLE 5

The experimental procedure was substantially the same as in Example 1 except that the planarizing coating solution was a 80% by weight solution of the same methoxymethylated benzoguanamine in propyleneglycol monomethyl ether acetate. This coating solution had good storage stability without any noticeable changes in the properties even after storage for 6 months at room temperature.

The planarity of the planarizing coating film as cured was found complete without detecting any stepped level differences on the surface. The planarity of the planarizing coating film after the etch-back treatment was also complete.

Comparative Example 1

The experimental procedure was substantially the same as in Example 1 except that the planarizing coating solution was a commercial product which was a 15% by weight solution of a novolak resin in 2-heptanone.

The result of the examination of the surface planarity with a scanning electron microscope was that the surface of the planarizing coating film as cured had a stepped level difference of 0.04 μm in conformity to the substrate surface. The surface planarity of the coating film after the etch-back treatment was also poor.

Comparative Example 2

A planarizing coating solution was prepared by dissolving 15 parts by weight of a polymethyl silsesquioxane resin having a weight-average molecular weight of 3000 in 85 parts by weight of a 55:20:25 by weight mixture of ethyl alcohol, butyl alcohol and methyl 3-methoxypropionate with further addition of 0.0001 part by weight of tetramethylammonium hydroxide.

The same silicon substrate as used in Example 1 was coated on a spinner with the thus prepared planarizing coating solution followed by evaporation of the solvent on a hot plate at 180° C. for 30 minutes and a baking treatment at 350° C. for 30 minutes to give a cured planarizing coating film having a thickness of 0.35 μm.

The result of the examination of the surface planarity with a scanning electron microscope was that the surface of the planarizing coating film as cured had a stepped level difference of 0.04 μm in conformity to the substrate surface. The surface planarity of the coating film after the etch-back treatment was also poor.

What is claimed is:

1. A method for the formation of a planarizing coating film on a substrate surface which comprises the steps of:

(a) coating the substrate surface with a coating solution consisting of an organic solvent and, as a film-forming solute uniformly dissolved in the organic solvent, a nitrogen-containing organic compound selected from the group consisting of melamine, benzoguanamine, acetoguanamine, glycoluril, urea, thiourea, guanidine, dicyandiamide, alkylene ureas and succinamide having, in a molecule, at least two amino or imino groups each substituted for the nitrogen-bonded hydrogen atom by a hydroxyalkyl group or an alkoxyalkyl group to form a coating layer;

(b) drying the coating layer by evaporating the organic solvent to form a dried coating layer; and (c) subjecting the dried coating layer to a baking treatment at a temperature in the range from 150 to 250° C.

2. The method for the formation of a planarizing coating film on a substrate surface as claimed in claim 1 in which the alkyl group of the hydroxyalkyl group and alkoxyalkyl group substituting the nitrogen-containing organic compound has 1 to 4 carbon atoms.

3. The method for the formation of a planarizing coating film on a substrate surface as claimed in claim 1 in which the alkoxy group of the alkoxyalkyl group substituting the nitrogen-containing organic compound has 1 to 4 carbon atoms.

4. The method for the formation of a planarizing coating film on a substrate surface as claimed in claim 1 in which the film-forming solute in the coating solution is a methoxymethylated benzoguanamine or a methoxymethylated melamine.

5. The method for the formation of a planarizing coating film on a substrate surface as claimed in claim 1 in which the organic solvent of the coating solution is selected from the group consisting of alkyleneglycol monoalkyl ethers and esters thereof.

6. The method for the formation of a planarizing coating film on a substrate surface as claimed in claim 1 in which the baking treatment in step (c) is conducted for a length of time in the range from 1 to 30 minutes.

* * * * *